(12) United States Patent
Lee et al.

(10) Patent No.: US 7,405,102 B2
(45) Date of Patent: Jul. 29, 2008

(54) METHODS AND APPARATUS FOR THERMAL MANAGEMENT IN A MULTI-LAYER EMBEDDED CHIP STRUCTURE

(75) Inventors: Tien Yu T. Lee, Phoenix, AZ (US);
Craig S. Amrine, Tempe, AZ (US);
Victor A. Chiriac, Phoenix, AZ (US);
Lizabeth Ann Keser, Chandler, AZ (US); George R. Leal, Cedar Park, TX (US); Robert J. Wenzel, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 99 days.

(21) Appl. No.: 11/450,667

(22) Filed: Jun. 9, 2006

(65) Prior Publication Data

US 2007/0284711 A1    Dec. 13, 2007

(51) Int. Cl.
*H01L 21/00* (2006.01)
(52) U.S. Cl. .................................. 438/106; 438/127
(58) Field of Classification Search ............... 438/122, 438/106, 127; 257/712
See application file for complete search history.

(56) References Cited

U.S. PATENT DOCUMENTS

| 5,483,100 | A |   | 1/1996 | Marrs |
| 5,563,773 | A | * | 10/1996 | Katsumata ............ 361/764 |
| 5,792,677 | A | * | 8/1998 | Reddy et al. ............ 438/122 |
| 5,841,193 | A |   | 11/1998 | Eichelberger |
| 5,886,399 | A | * | 3/1999 | Ohsawa et al. ........... 257/668 |
| 6,159,767 | A |   | 12/2000 | Eichelberger |
| 6,599,799 | B2 | * | 7/2003 | Tang et al. ............... 438/253 |
| 6,838,776 | B2 |   | 1/2005 | Leal |
| 6,921,975 | B2 |   | 7/2005 | Leal |
| 6,951,773 | B2 | * | 10/2005 | Ho et al. ............... 438/106 |
| 2005/0133903 | A1 |   | 6/2005 | Palanduz |

FOREIGN PATENT DOCUMENTS

| EP |   | 0777274 A1 | 4/1997 |
| WO | WO 02/33751 A2 | 4/2002 |
| WO | WO 2005/004200 A3 | 1/2005 |

* cited by examiner

*Primary Examiner*—Roy K Potter
(74) *Attorney, Agent, or Firm*—Ingrassia, Fisher & Lorenz, P.C.

(57) ABSTRACT

A multi-layer structure (102) includes a first build-up layer structure (202) configured to connect to a heat-generating module (120), a second build-up layer structure (206) configured to connect to a substrate, and a middle layer (204) provided between the first build-up layer structure and the second build-up layer structure, the middle layer including at least one semiconductor component (110) and a heat spreader (130). A first set of thermal vias (210) extend through the first build-up layer structure to the heat spreader, and a second set of thermal vias (2100) extend through the second build-up layer structure to the heat spreader, wherein at least a portion of the first set of thermal vias is in thermal contact with the heat-generating module.

12 Claims, 4 Drawing Sheets

METHODS AND APPARATUS FOR THERMAL MANAGEMENT IN A MULTI-LAYER EMBEDDED CHIP STRUCTURE

FIELD OF THE INVENTION

The present invention generally relates to thermal management in semiconductor assemblies and, more particularly, to methods of enhancing heat transfer in multi-layer embedded chip structures coupled to one or more heat-generating components.

BACKGROUND OF THE INVENTION

Semiconductor devices continue to decrease in size and increase in power-density, resulting in a number of challenges for system designers. One of the primary challenges relates to microelectronic device cooling—i.e., how to efficiently remove heat generated by the device during operation.

Traditional multi-layer high-density interconnects (HDI) typically have an organic substrate and are soldered to a printed circuit board (PCB) such that the heat-generating chips have an efficient heat transfer path to the board. In advanced multi-layer embedded chip packages, however, it is possible to incorporate one or more semiconductor devices (e.g., memory devices) within or on top of one or more build-up layers containing vias, dielectrics, etc., which are held together in an integrated package by encapsulants and the like. Because of the thermal boundary conditions presented by such interconnect structures, it is difficult to attach power amplifiers and other high-power components in such a way that heat from these power devices can be dissipated efficiently. That is, as such multi-layer embedded chip packages consist of low thermal conductivity layers of dielectric with sparsely-distributed metal interconnects and electrical vias, their effective thermal resistance is very high. It is therefore undesirable to stack high-power amplifiers, microprocessors, and other components on these multi-layer structures.

Accordingly, there is a need for methods and structures that improve heat transfer in embedded chip packages by overcoming these and other shortcomings of the prior art. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements, and FIG. 1 top view of an assembly in accordance with an exemplary embodiment.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description. For the sake of brevity, conventional techniques related to semiconductor processing, electronic packaging, and device assembly are not described herein.

In general, a multi-layer embedded chip structure (also referred to as "embedded chip" or "chips first") in accordance with various embodiments includes an embedded heat spreader and a plurality of thermal vias extending from the heat spreader to the external environment (i.e., through the top and bottom build-up layers), thereby improving heat conduction and helping to cool any heat-generating components that are attached to the structure.

Figure 1:
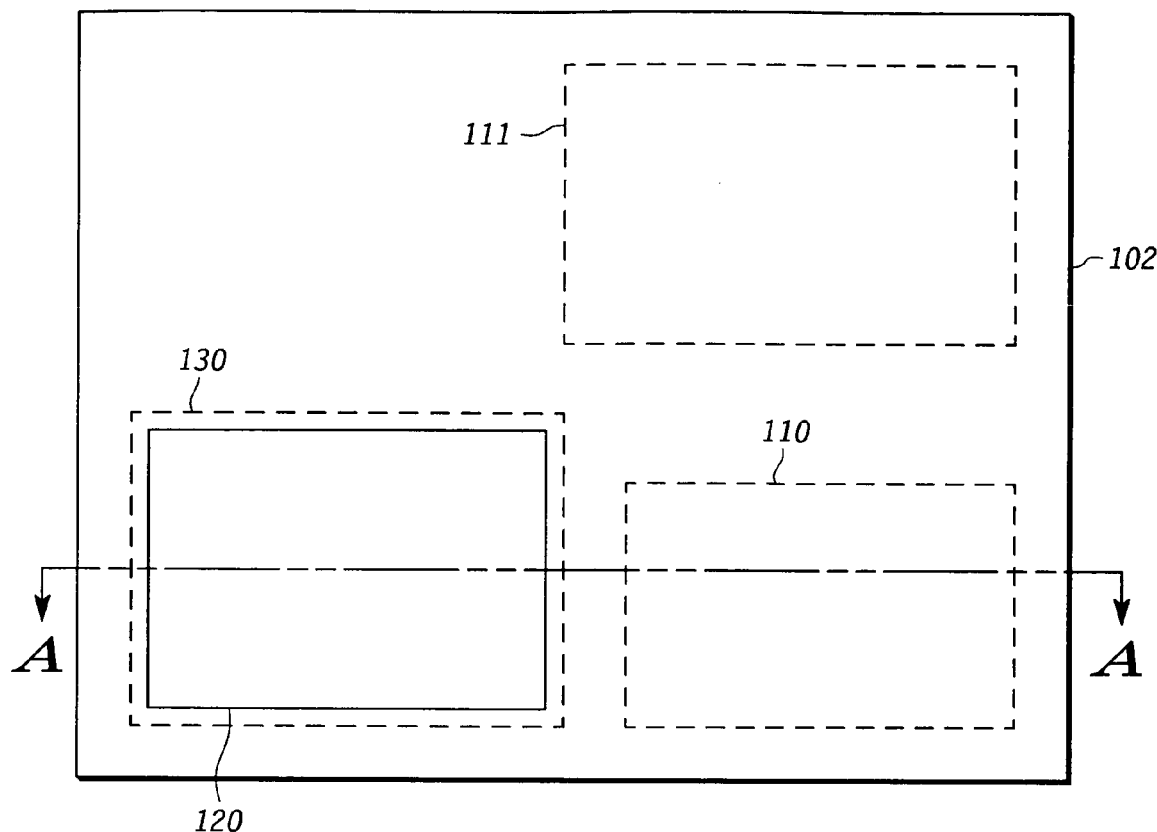
Figure 2:
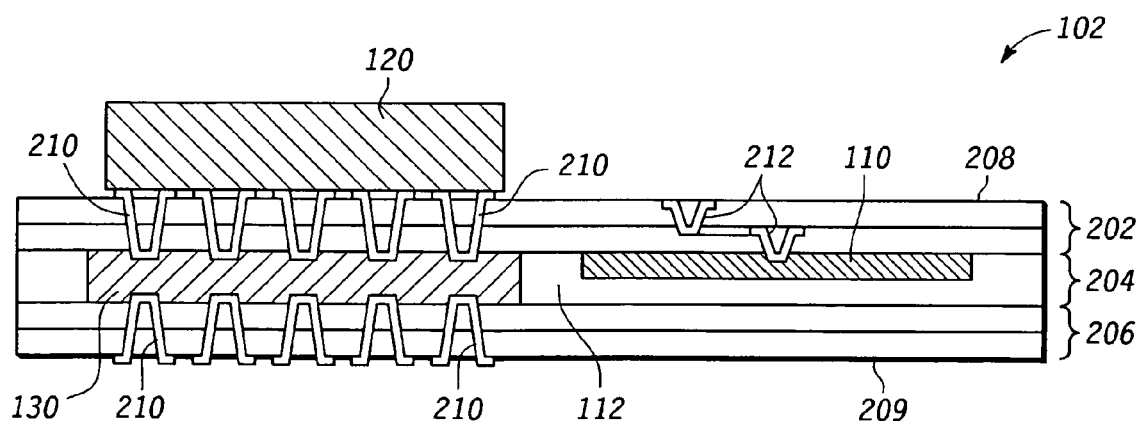
FIG. 2 is a cross-sectional view of the assembly shown in FIG. 1.

While the methods and systems described herein may be used in a wide variety of packaging applications, FIGS. 1 and 2 depict a structure useful in describing the various exemplary embodiments. More particularly, FIG. 1 is a top view of an assembly, and FIG. 2 is a cross-sectional view through section A-A of that assembly. As illustrated, a module 120 (e.g., a power amplifier module, power integrated circuit, and/or various other stacked modules) is attached through any convenient means to a multilayer embedded chip structure ("multilayer structure" or simply "structure") 102. Structure 102 includes a build-up layer 202 (referred to occasionally as the "top" build-up layer), a build up layer 206 (referred to occasionally as the "bottom" build-up layer), and a middle panel layer (or simply "middle layer") 204. Bottom build up layer 206 is configured to attach (at surface 209 opposite surface 208) to a printed circuit board or other such substrate (not shown), e.g., using conventional solder bond techniques.

Middle layer 204 includes one or more heat spreaders 130 and one or more semiconductor components 111, 110 (e.g., memory devices, integrated circuits, etc.) bonded by an encapsulant 112 or other such material provided within layer 204 (as more fully described below). Component 110 is shown coupled to build-up layer 202, but might also be coupled to build-up layer 206. Each build up layer 202 and 206 includes one or more thermal vias 210 and/or electrical vias 212 as well as various interconnects, dielectrics, multi-layer metallization, and other components that allow electrical communication and heat transfer from middle layer 204 through top and bottom layers 202 and 206. A first set of thermal vias 210 extend through the build-up layer 202 to heat spreader 130, and a second set of thermal vias 210 similarly extend through build-up layer 206 to heat spreader 130, wherein at least a portion of the first set of thermal vias in thermal contact with module 120. The term "thermal contact" as used herein means that heat conduction occurs directly or indirectly between those two entities.

It will be appreciated that the embodiment shown in FIGS. 1 and 2 is simplified for the purpose of clarity, and that a typical structure 102 might also include any number of passive and active components in electrical communication with semiconductor 110 and any components mounted thereto. For example, various baseband ICs, transceivers, power management modules, and the like may be used in an integrated radio application. Additional information regarding such embedded chip structures may be found, for example, in U.S. Pat. No. 6,838,776 and U.S. Pat. No. 6,921,975, owned by the present assignee.

Heat spreader 130 comprises a homogeneous or non-homogeneous material capable of fulfilling the heat-transfer requirements of the system—i.e., assisting with vertical and horizontal conduction of heat in a relatively efficient manner. In this regard, heat spreader 130 may have any rectilinear or curvilinear shape, and may be formed from any particular material or materials, including various metals, ceramics, or composites. In one embodiment, for example, heat spreader 130 comprises a copper or copper alloy. In another, heat spreader 130 is a ceramic material such as aluminum oxide or aluminum nitride. In yet another embodiment, thermally-conductive, filled vias are used in place of heat spreader 130 within middle layer 204.

Thermal vias 210 comprise any structure capable of conducting heat through the various build-up layers. In this regard, thermal vias 210 might consist of conventional plated vias traditionally used in connection with printed circuit board (PCB) technology, or might be metal-filled (e.g., copper-filled) via structures. Furthermore, multiple thermal via layers may be formed by successive plating and etching to form vertical stacks of such vias.

The shape, thickness, spacing, density, and size of the thermal vias may vary. For example, they may be spaced in a regular array, a staggered array, a random pattern, or any other suitable configuration. In one embodiment, the thermal vias are roughly 80 microns in diameter, are filled with copper, and are spaced in a regular grid with a pitch of approximately 180 microns. In another embodiment, the vias are 200 microns in diameter and have a pitch of 300 microns. In one embodiment, the vias have a 9-30 micron thick plated copper wall and are filled with solder (e.g., when module 120 is attached).

Similarly, the size, shape, and thicknesses of the various layers that make up multi-layer structure 102 may be selected to meet any particular design objectives. In one embodiment, for example, build up layers 206 have a thickness of approximately 20 to 200 microns, and middle layer 130 has a thickness of approximately 0.2-1.5 mm. In one embodiment, structure 102 is a 5×5 to 30×30 mm square, but may have any suitable size and shape.

Figure 3:
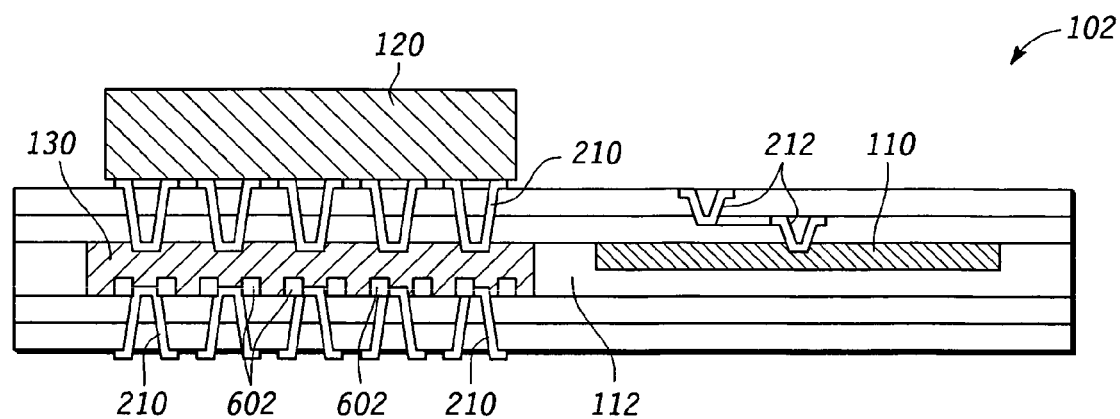
FIG. 3 is a cross-sectional overview of an assembly in accordance with an alternate embodiment.

In one embodiment, a number of slots, dimples, or other such structures are formed within the heat spreader such that it has improved adhesion to one or more build-up layers. That is, referring to FIG. 3, a series of slots 602 extending partially through the thickness of heat spreader 130 are formed such that they bond with the build up layers.

In accordance with another aspect, thermal vias 210 are strategically placed below module 120 in areas that correspond to individual heat-generating devices contained within the module package, rather than under the entire module. That is, referring to FIG. 4, a module 120 is illustrated superimposed upon a pattern of thermal vias 210. Areas 402 corresponding to individual heat-generating devices within module 120 are indicated by dashed rectangles, although in practice they may have a variety of shapes, corresponding, for example, to the outline of a heat-generating die, component, or power circuit area. In one embodiment, wherein module 120 comprises a power amplifier having individual die with a size of about 2×2 mm, thermal vias 210 are similarly designed as rectangular areas about 2×2 mm square.

Figure 4:
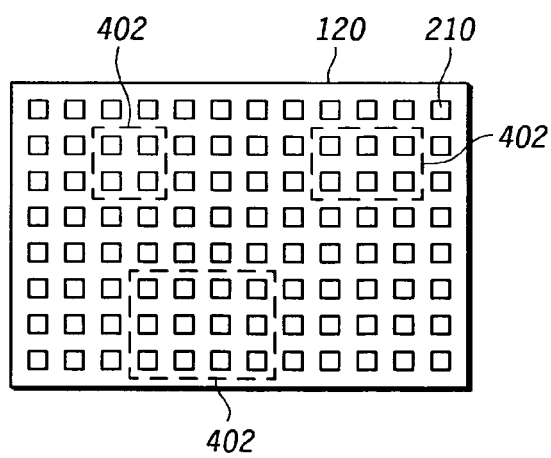
FIG. 4 is a top view of a module and associated thermal vias in accordance with one embodiment.
Figure 5:
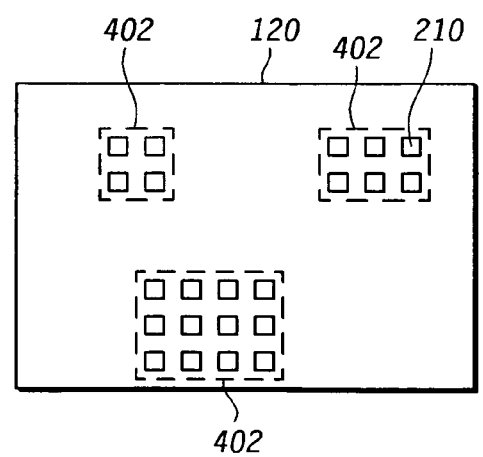
FIG. 5 is a top view of a module and associated thermal vias in accordance with an alternate embodiment.

In FIG. 4, a regular rectangular array of thermal vias 210 are formed under the entire footprint of module 120. For a power amplifier module that is 8×8 mm, for example, the thermal vias 210 may also be formed in an 8×8 mm grid. This footprint might correspond, for example, to a solder bond area below module 120. In contrast, FIG. 5 shows an embodiment wherein thermal vias 210 are formed only under heat-generating devices 402 (e.g., individual power transistors within a power amplifier module). For the purposes of clarity, no heat spreader has been illustrated in these figures, but it will be understood that one or more heat spreaders may be positioned (and connected to vias 210) in whatever manner fulfills the specific heat-transfer design goals.

Fabrication and processing of vias, dielectrics, encapsulants, and the like are known in the art, and need not be described in detail herein. It will be appreciated that while an individual multi-layer structure 102 is shown in the figures, it is possible to create multiple structures simultaneously, then singulate individual structures for testing.

Figure 6:
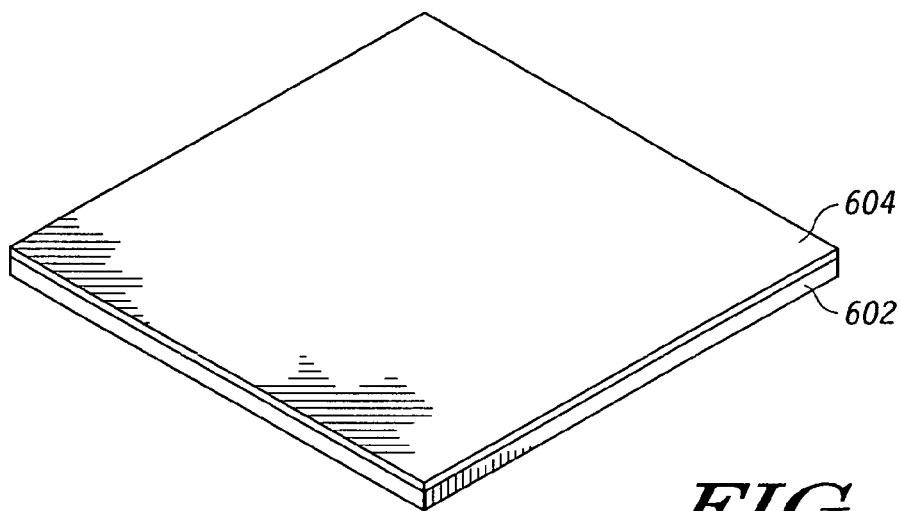
FIGS. 6-11 depict an example process for manufacturing a middle panel layer in accordance with one embodiment.
Figure 7:
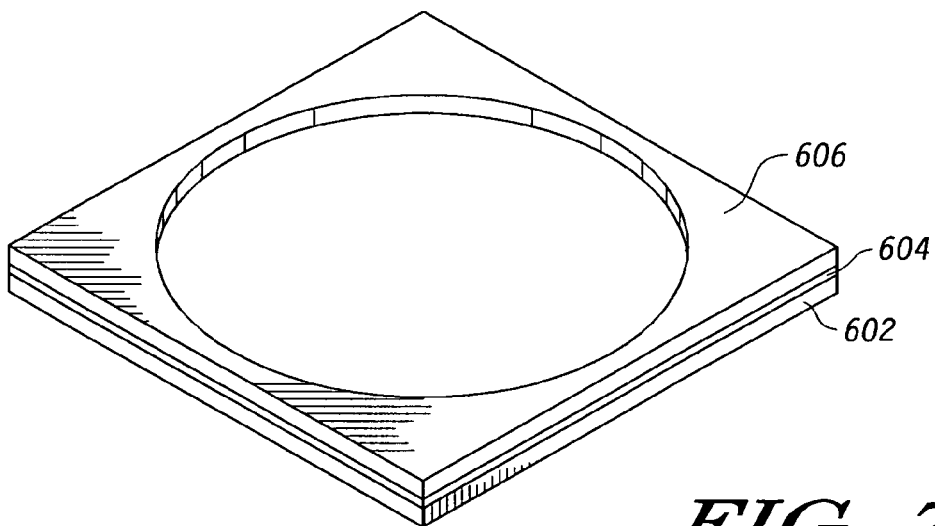
Figure 8:
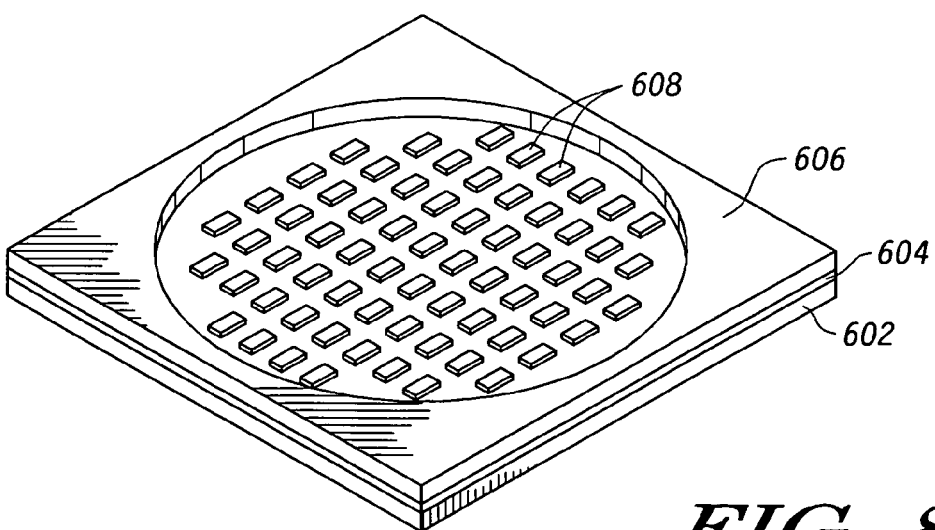
Figure 9:
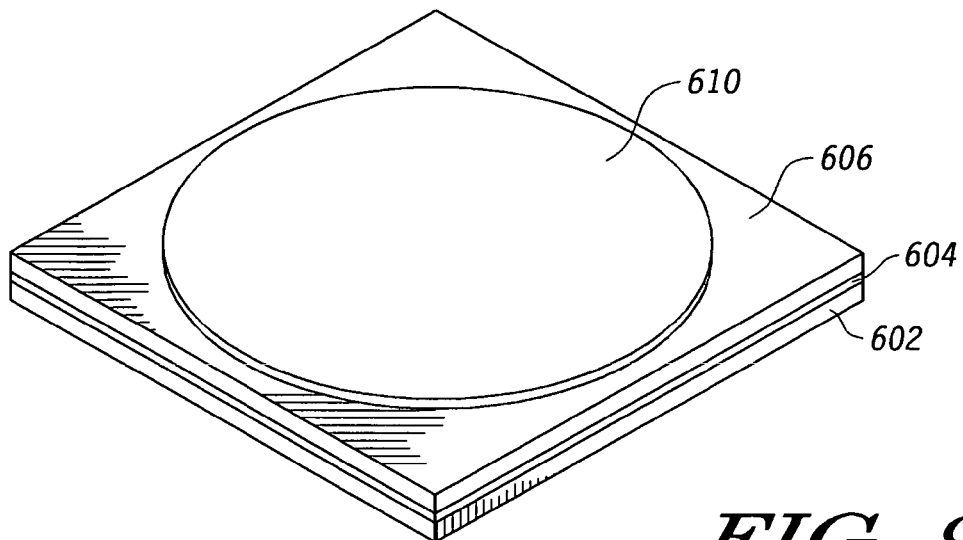
Figure 10:
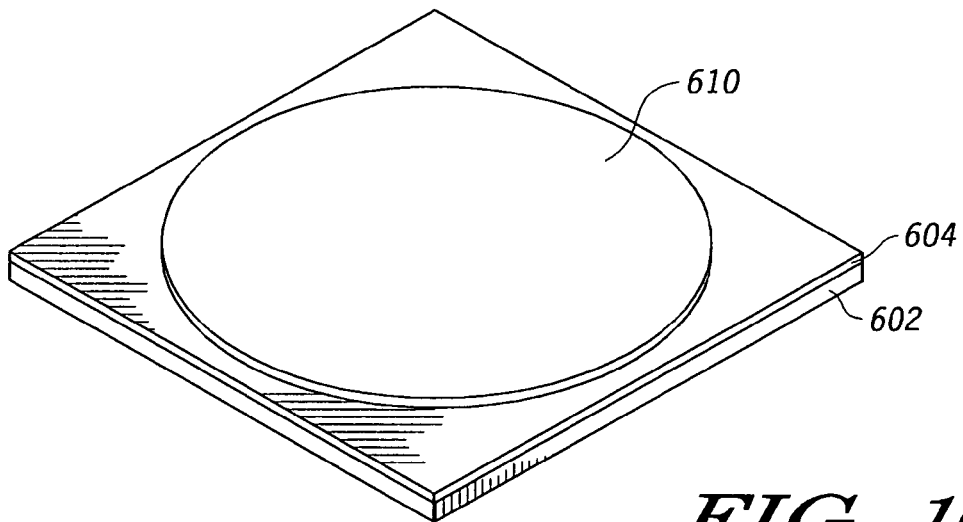
Figure 11:
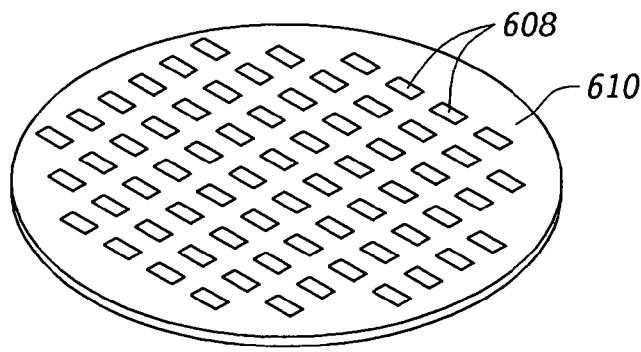

In one embodiment, middle layer 204 is fabricated first, and top and bottom build-up layers 202 and 206 are formed thereon. That is, referring to the simplified process illustrated in the isometric diagrams of FIGS. 6-11, substrate 602 is coated with an adhesive 604 (FIG. 6). Next, a mold frame 606 is secured to the surface of the adhesive 604 (FIG. 7). A number of die 608 (e.g., semiconductors) of the same or varying types are placed, active side down, along with one or more heat spreaders, in a predetermined pattern on tape 604 (FIG. 8). An epoxy or other encapsulant material 610 is deposited onto the assembly such that it covers die 608 and substantially fills up the space there between (FIG. 9). Next, mold frame 606 is removed (FIG. 10). The surface of encapsulant 610 can be ground down to the desired thickness—i.e., until the backside surface of the individual die 608 are exposed (FIG. 11). The resulting middle panel layer structure is then suitably processed to form the top and bottom build-up layers (202 and 206 in FIG. 2) using conventional methods. It will be appreciated that various additional steps involving cleaning, curing, and/or baking might also be performed at various times in the process.

In summary, what has been described is a multi-layer embedded chip structure comprising: a first build-up layer structure configured to connect to a heat-generating module; a second build-up layer structure configured to connect to a substrate; a middle layer provided between the first build-up layer structure and the second build-up layer structure, the middle layer including at least one semiconductor component and a heat spreader; a first set of thermal vias extending through the first build-up layer structure to the heat spreader, and a second set of thermal vias extending through the second build-up layer structure to the heat spreader, wherein at least a portion of the first set of thermal vias is in thermal contact with the heat-generating module.

In one embodiment, the heat-generating module is a power amplifier module including at least one power transistor device. The first set of thermal vias may have a via pattern substantially corresponding to a position of at least one power transistor device or substantially corresponding to a footprint of the heat-generating module.

In one embodiment, the heat spreader includes a plurality of slots opening to at least one of the first and second build-up layers. In another, the heat spreader includes at least one through-hole extending from the first build-up layer and the second build-up layer. The heat spreader may comprise a material selected from the group consisting of metal and ceramic. The thermal vias may be copper-filled.

In accordance with a method for improving heat transfer in an electronic assembly, the following steps are performed: providing a heat-generating module; providing a multi-layer embedded chip structure having a top surface and a bottom surface, wherein a predetermined area on the top surface is configured to connect to the heat-generating module, and the bottom surface is configured to connect to a substrate; the multi-layer embedded chip structure comprising a heat spreader and a semiconductor device, wherein the heat spreader is substantially coincident with the predetermined location and has a plurality of thermal vias thermally coupled to the heat spreader and extending to the top and bottom surfaces of the multi-layer embedded chip structure; connecting the heat-generating module to the predetermined location on the top surface of the multi-layer embedded chip structure; and connecting the bottom surface of the multi-layer embedded chip structure to a substrate. Providing the heat generating module might include providing a power amplifier module comprising at least one power transistor device, but might also include a high-power microprocessor die, sub-module, or the like.

In another embodiment, a method for fabricating a multi-layer embedded chip structure includes forming a panel layer comprising a heat spreader, a semiconductor die, and an encapsulant provided therebetween; forming, on the panel layer, a bottom build-up layer structure configured to connect to a heat-generating module, the bottom build-up layer including a plurality of thermal vias and a plurality of electrical vias; and forming a top build-up layer structure on the panel layer, the top build-up layer structure including a plurality of thermal vias thermally coupled to the heat spreader, and a plurality of electrical vias coupled to the semiconductor die. Forming the middle layer may include: placing the semiconductor die and the heat spreader on a surface; depositing the encapsulant material on the semiconductor die, the heat spreader, and the surface; and grinding the encapsulant material to expose a portion of the semiconductor die.

Forming the panel layer may include forming or inserting a metallic heat spreader, and the semiconductor die may be a memory component. In one embodiment, the plurality of thermal vias has a via pattern substantially corresponding to a predetermined position on the top build-up layer. In another, the heat spreader includes a plurality of slots opening to at least one of the top and bottom build-up layers. In yet another embodiment, the heat spreader includes at least one through-hole or slot extending from the first build-up layer and the second build-up layer.

The heat spreader may comprise, for example, a material selected from the group consisting of metal and ceramic, and the thermal vias may be copper-filled. In one embodiment, the step of forming the top build-up layer includes forming a plurality of dielectric layers and/or forming the middle layer includes forming at least one dielectric layer.

The exemplary embodiment or exemplary embodiments presented above are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for improving heat transfer in an electronic assembly, the method including:
    providing a heat-generating module;
    providing a multi-layer embedded chip structure having a top surface and a bottom surface, wherein a predetermined area on the top surface is configured to connect to the heat-generating module, and the bottom surface is configured to connect to a substrate; the multi-layer embedded chip structure comprising a heat spreader and a semiconductor device, wherein the heat spreader is substantially coincident with the predetermined location and has a plurality of thermal vias thermally coupled to the heat spreader and extending to the top and bottom surfaces of the multi-layer embedded chip structure;
    connecting the heat-generating module to the predetermined location on the top surface of the multi-layer embedded chip structure; and
    connecting the bottom surface of the multi-layer embedded chip structure to a substrate.

2. The method of claim 1, wherein providing the heat generating module includes providing a power amplifier module comprising at least one power transistor device.

3. A method for fabricating a multi-layer embedded chip structure, the method comprising:
    forming a panel layer, the panel layer comprising a heat spreader, a semiconductor die, and an encapsulant material provided between the heat spreader and semiconductor die; and
    forming, on the panel layer, a bottom build-up layer structure configured to connect to a heat-generating module such that the heat-generating module is aligned with a plurality of thermal vias thermally coupled to the heat spreader through the bottom build-up layer structure and
    forming a top build-up layer structure on the panel layer, the top build-up layer structure including a plurality of thermal vias coupled to the heat spreader and exposed on a surface of the top build-up layer.

4. The method of claim 3, wherein forming the panel layer includes forming a metallic heat spreader.

5. The method of claim 3, wherein the semiconductor die is a memory component.

6. The method of claim 3, wherein the plurality of thermal vias has a via pattern substantially corresponding to a predetermined position on the top build-up layer.

7. The method of claim 3, wherein the heat spreader includes a plurality of slots opening to at least one of the top and bottom build-up layers.

8. The method of claim 3, wherein forming the panel layer includes:
    placing the semiconductor die and the heat spreader on a surface;
    depositing the encapsulant material on the semiconductor die, the heat spreader, and the surface; and
    grinding the encapsulant material to expose a portion of the semiconductor die.

9. The method of claim 3, wherein the heat spreader comprises a material selected from the group consisting of metal and ceramic.

10. The method of claim 3, wherein forming the thermal vias includes forming copper-filled vias.

11. The method of claim 3, wherein the step of forming the top build-up layer includes forming a plurality of dielectric layers.

12. The method of claim 3, wherein forming the top build-up layer includes forming a plurality of electrical vias coupled to the semiconductor die.

* * * * *